US010746784B2

(12) United States Patent
Ormston

(10) Patent No.: US 10,746,784 B2
(45) Date of Patent: Aug. 18, 2020

(54) SYSTEM LEVEL HEALTH MONITORING IN TEST SYSTEMS

(71) Applicant: NATIONAL INSTRUMENTS CORPORATION, Austin, TX (US)

(72) Inventor: Jesse D. Ormston, Burlington (CA)

(73) Assignee: National Instruments Corporation, Austin, TX (US)

( * ) Notice: Subject to any disclaimer, the term of this patent is extended or adjusted under 35 U.S.C. 154(b) by 103 days.

(21) Appl. No.: 16/180,967

(22) Filed: Nov. 5, 2018

(65) Prior Publication Data

US 2019/0137566 A1 May 9, 2019

Related U.S. Application Data

(60) Provisional application No. 62/582,031, filed on Nov. 6, 2017.

(51) Int. Cl.
*G01R 31/28* (2006.01)

(52) U.S. Cl.
CPC ................................ *G01R 31/2834* (2013.01)

(58) Field of Classification Search
CPC ... G01V 3/18; G01V 1/52; G01V 3/34; G01V 3/38; G01V 5/04; E21B 47/00; E21B 4/02; E21B 7/062
USPC ................ 324/366, 346, 333, 334, 338, 339
See application file for complete search history.

(56) References Cited

U.S. PATENT DOCUMENTS

| | | | | |
|---|---|---|---|---|
| 6,181,140 | B1 | 1/2001 | Vokey et al. | |
| 6,223,229 | B1 | 4/2001 | Kvamme | |
| 6,580,268 | B2 * | 6/2003 | Wolodko | E21B 47/0008 324/227 |
| 6,765,385 | B2 * | 7/2004 | Sinclair | G01V 3/30 324/338 |
| 2008/0240724 | A1 | 10/2008 | Aguren | |
| 2009/0032577 | A1 | 2/2009 | Aguren et al. | |
| 2011/0099569 | A1 | 4/2011 | Sadja et al. | |
| 2011/0099570 | A1 | 4/2011 | Sadja et al. | |
| 2011/0161050 | A1 | 6/2011 | Montena et al. | |
| 2014/0306711 | A1 * | 10/2014 | Hu | G01V 3/20 324/367 |
| 2015/0318917 | A1 | 11/2015 | Aguren | |
| 2016/0131694 | A1 | 5/2016 | Chen et al. | |
| 2018/0188310 | A1 | 7/2018 | Koeppendoerfer et al. | |

* cited by examiner

*Primary Examiner* — Giovanni Astacio-Oquendo
(74) *Attorney, Agent, or Firm* — Kowert Hood Munyon Rankin and Goetzel PC; Jeffrey C. Hood

(57) ABSTRACT

To perform system level physical connectivity monitoring measurements, a test signal may be generated in an instrument and transmitted down a signal path extending from the instrument to a device. In a static state (high or low), the test signal generator may produce a specified AC impedance at the point where the signal path connects to the instrument for a designated back termination. A response signal resulting from the test signal may be acquired and used to obtain an impedance value and/or reflection coefficient value representative of the signal path and an additional signal path extending from the source of the test signal to the signal path. The measured response may be compared to an expected response to determine a condition of any component(s) in the signal path and/or in the additional signal path. The expected response may be represented by masks (low and high) created during automated test development.

20 Claims, 6 Drawing Sheets

SYSTEM LEVEL HEALTH MONITORING IN TEST SYSTEMS

PRIORITY CLAIM

This application claims benefit of priority of U.S. Provisional Patent Application Ser. No. 62/582,031 titled "System Level Health Monitoring in Test Systems", filed on Nov. 6, 2017, which is hereby incorporated by reference as though fully and completely set forth herein.

BACKGROUND OF THE INVENTION

Field of the Invention

This invention relates generally to measurement and data acquisition systems and, more particularly, to improving system level health monitoring in test systems.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPM (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include Source-Measure Units (SMUs), which may apply a voltage to a DUT and measure the resulting current, or may apply a current to the DUT and measure the resulting voltage. Measurement systems, e.g. DAQ devices as noted above, may also include oscilloscopes and/or other types of signal analyzers, signal generators, function analyzers, etc.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT or to influence the system being controlled.

Many present day automated test systems often route signals through cables, connectors, relays, and PCBs. One of the major sources of automated test failure is the wearing out of these cables, connectors, relays, etc. For example, every cable's connector has a limited number of total insertions, every relay has an estimated number of switches before it can fail. The failure of such components can lead to poor first pass yields, increased total test time, and increased manufacturing cost. These failures can also be intermittent, resulting in an extended failure time period before being identified as the root cause of a test failure.

Other corresponding issues related to the prior art will become apparent to one skilled in the art after comparing such prior art with the present invention as described herein.

SUMMARY OF THE INVENTION

In some embodiments, an instrument in an automated test system may have the ability to measure connected cables between the input of the instrument and a device under test coupled to the instrument, to help identify when the input has undergone enough wear to prompt maintenance, to prevent actual failure and production downtime caused by interconnectivity equipment failure, or more generally by equipment failure. In some embodiments the instrument may include a processing unit executing program instructions (i.e. software; SW), a data acquisition (DAQ) hardware device for acquiring sample data and/or generating control signals, and host memory configured to store data samples and various other data associated with the DAQ and processor operations. However, various other embodiments may feature systems that include other instruments, e.g. measurement instruments or signal generators or a variety of other similar equipment. The instruments may include multiple components that may themselves be individually characterized as instruments. For example, the instrument may be an oscilloscope, a source measure unit, a digitizer, a vector analyzer, a digitizer, signal generator, function generator, vector analyzer, etc.

In some embodiments, system level health may be monitored through the use of a pulse generator built into the instrument used in the system. For example, the pulse generator may be built into an input stage of the instrument, or the pulse generator and an analog-to-digital converter (ADC) may be built into the instrument, for example into a function generator. More generally, a pulse generator may be used for performing system level health monitoring according to the various embodiments described herein. Accordingly, the pulse generator in the instrument (e.g. in the input stage of the instrument) may be used to generate a test signal down a signal path extending from the instrument (e.g. from the input of the instrument) to a device. A data acquisition circuit may be used to obtain a response signal generated in response to the test signal. Subsequently, based at least on the response signal, a measured response representative of the signal path may be obtained and may be compared with/to an expected response. When the pulse generator is connected to an input stage, a measured response representative of the signal path and/or at least a portion of the input stage may be obtained and may be compared with/to the expected response. From the comparison, a health of the signal path (and/or the input stage) may be obtained. In some embodiments, the measured response may be used to obtain at least one parameter value associated with the signal path (and/or at least a portion of the input stage), and the expected response may be used to obtain at least one expected parameter value representative of the signal path (and/or at least a portion of the input stage). Comparing the measured response with/to the expected response may then include comparing the obtained at least one parameter value with the at least one expected parameter value. In some embodiments, when in a static state, the pulse generator may produce a specified AC input impedance (e.g. at the input stage) for a designated back termination. In some embodiments, instead of providing a back termination the pulse generator may be switched out of the circuit or it may be set into a high impedance mode.

It should be noted that as used herein the signal path, where the generated test signal/pulse travels, may include any one or more of the following: at least a portion of the input stage, any cabling between the input stage and the connected device, and/or any other component coupling/connecting the instrument to the coupled device at the other end of the signal path. Overall, the signal path is designated to encompass the path extending from the point of origin of the pulse to the device under test.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
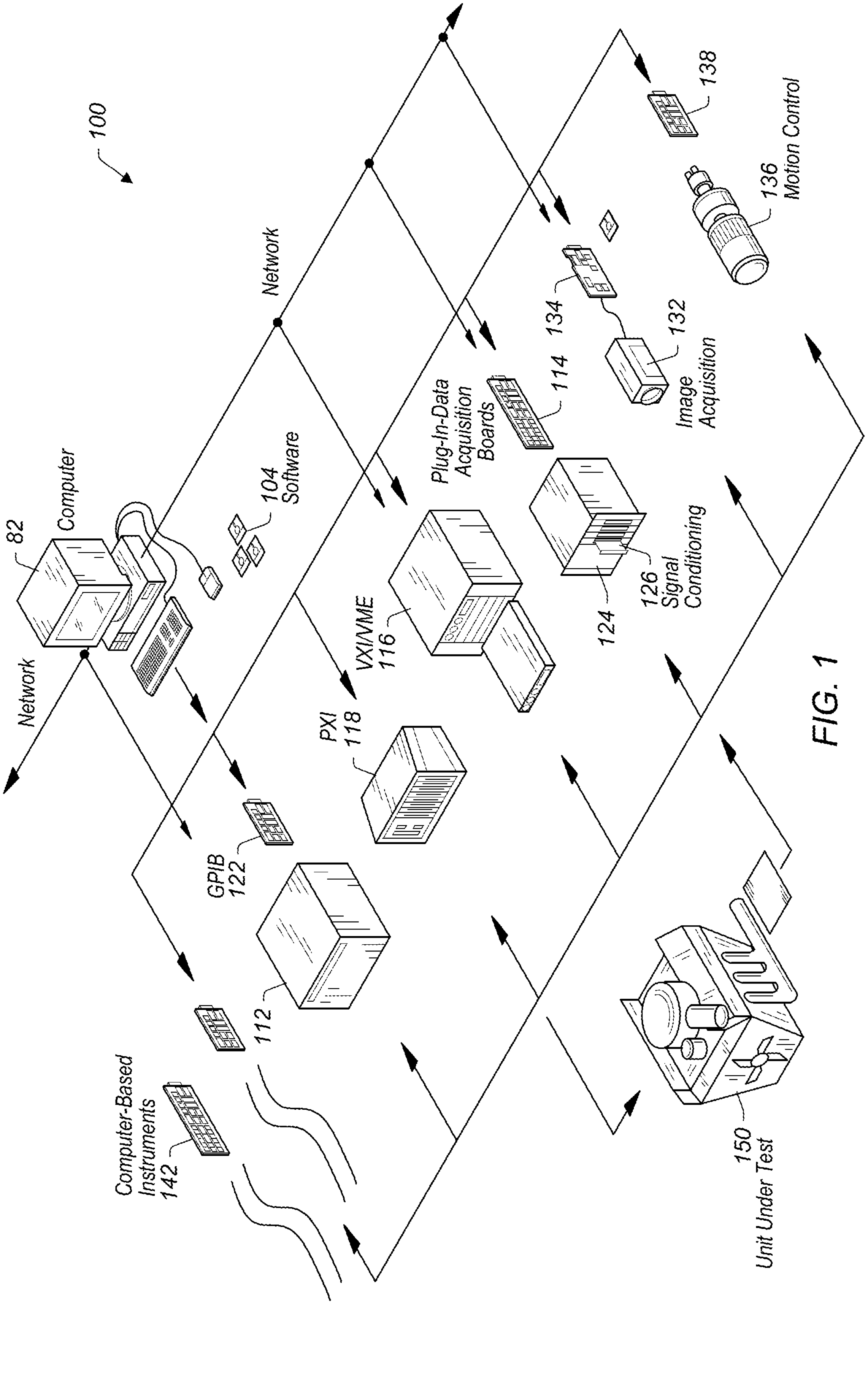
FIG. 1 shows an instrumentation control system with instruments networked together according to one set of embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc.

FIG. 1 illustrates an exemplary instrumentation control system 100 which may be configured according to embodiments of the present invention. System 100 comprises a host computer 82 which may couple to one or more instruments configured to perform a variety of functions using system level health monitoring implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument

118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
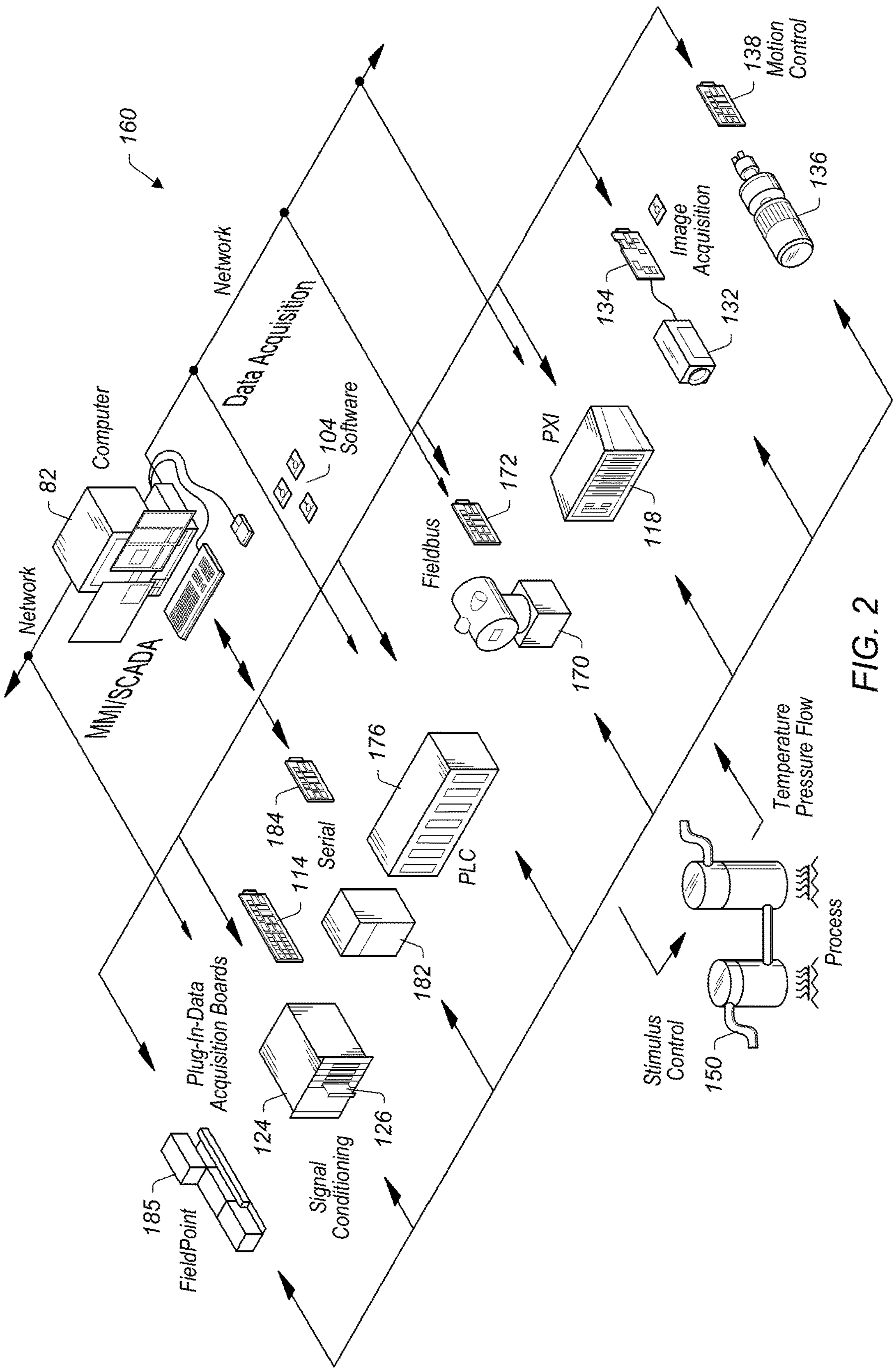
FIG. 2 shows an industrial automation system with instruments networked together according to one set of embodiments.

FIG. 2 illustrates an exemplary industrial automation system 160 that may be configured according to embodiments of the present invention. Industrial automation system 160 may be similar to instrumentation or test and measurement system 100 shown in FIG. 1. Elements that are similar or identical to elements in FIG. 1 have the same reference numerals for convenience. System 160 may comprise a computer 82 which may couple to one or more devices and/or instruments configured to perform a variety of functions using system level health monitoring implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection, which may facilitate running a high-level synchronization protocol between the computer system and the coupled instruments/devices.

In one set of embodiments, any one or more of the instruments and/or the various connectivity interfaces of computer 82 (coupling computer 82 to the one or more devices) may be implemented with system level health monitoring as will be further described in detail below. Generally, various embodiments disclosed herein facilitate an instrument, for example an instrument configured in an automated test system, measuring at least an impedance response of cables connecting the instrument input to a device under test, to help identify when wear of certain component(s), e.g. connectors and/or cables that connect the instrument to the device under test (or to any designated other system component) has reached a stage at which it might result in failure, which itself may cause actual production downtime, unless maintenance on the affected component(s) is performed.

While various embodiments are described herein in greater detail with respect to the implementation of system level health monitoring technology in an oscilloscope or digitizer, the system level health monitoring technology described herein may equally be used with and/or extended to many other test instruments such as a function generator or digital test equipment (i.e. semiconductor test digital with per pin PMU). While the hardware implementation details with respect to the generation of pulse(s) and the acquisition of the resulting signals may differ from those provided in the example(s) discussed in greater detail herein, other embodiments and/or implementations of the system level health monitoring technology disclosed herein may operate according to the signal sampling and pulse generation methods as discussed herein. For example, for a digitizer, the output may be a digital output and the input may be an oscilloscope input. For an HSDIO (high-speed digital input output) digital test device the output may be a digital output and real-world signals may be sampled using a "scope mode feature" and converted into a voltage vs. time plot. Furthermore, in cases where the device (under test) is coupled to an output of the instrument, the monitored path may extend between the output of the instrument and the device, as opposed to between an input of the instrument and the device. Those of ordinary skill in the art will appreciate the application of the system level health monitoring technology disclosed herein to various other instruments and/or test/measurement/control systems.

Figure 3:
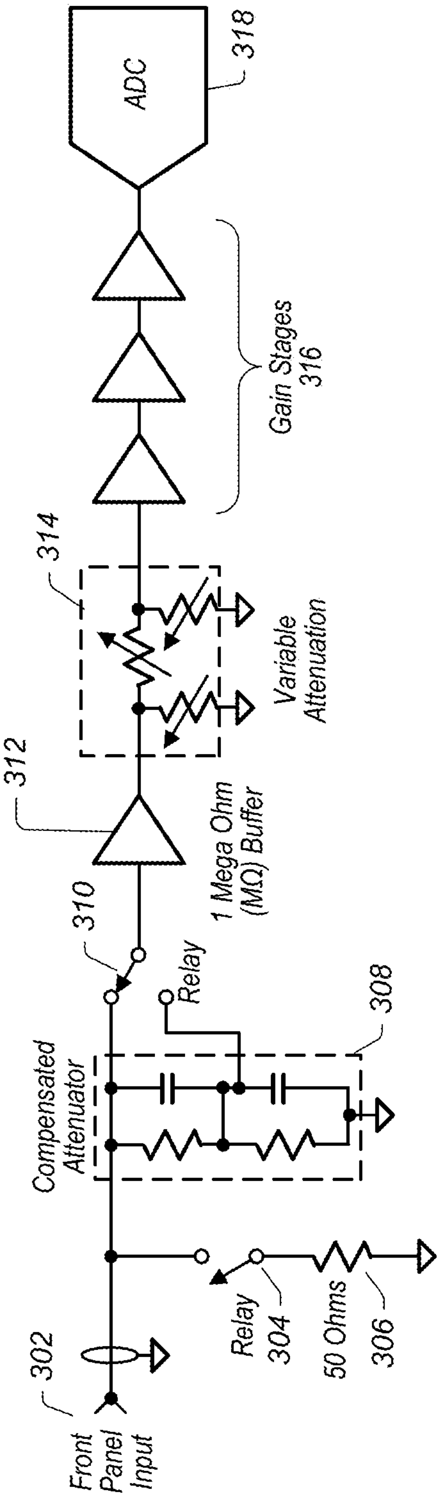
FIG. 3 shows a simplified circuit diagram of a typical real-time oscilloscope input, according to prior art.

As an exemplary embodiment for measuring the connectivity between a connection (which may be an input connection or output connection) of an instrument and a device (under test) is provided by way of an input stage of an oscilloscope. A typical digital real-time oscilloscope may sample a real world analog signal in one single shot if the bandwidth and sample rate is sufficient. A typical analog input stage of a real-time oscilloscope according to prior art is shown in FIG. 3. It includes both a 1 MΩ input and a 50Ω input. The 50Ω input includes 50Ω input resistance 306, while the 1 MΩ input includes 1 MΩ buffer 312. The 1 MΩ input further includes compensated attenuator stages 308, a variable attenuation stage 314, and gain stages 316 coupling to an ADC 318 where the input signal applied at front panel input 302 may be digitized. For establishing the 50Ω input, a simple relay 304 may be used to couple (or connect) front panel input 302 to the 50Ω shunt 306. This type of input stage allows for signal acquisition, but is incapable of measuring the connectivity between the front panel input 302 connection and the device under test (which may be connected to the right of ADC 318 to an output of the instrument, not shown).

Figure 4:
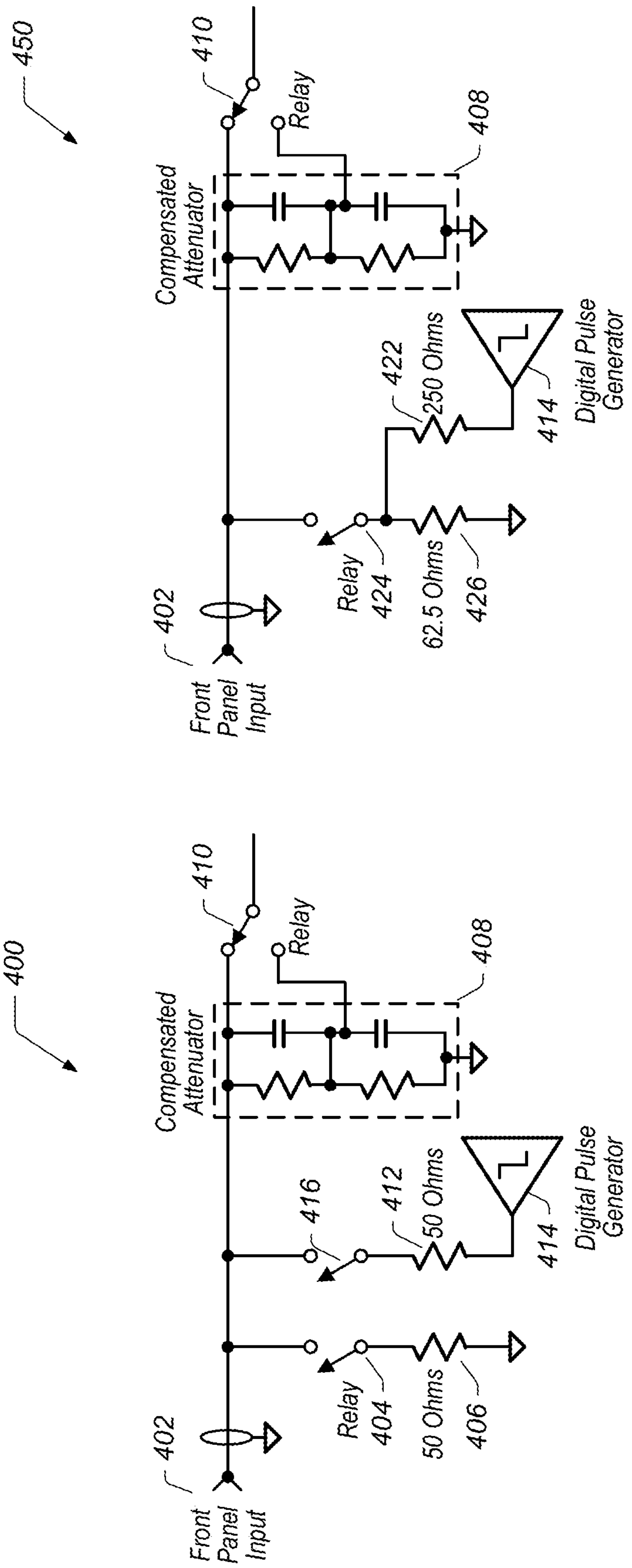
FIG. 4 shows simplified circuit diagrams of two exemplary implementations of an oscilloscope input with added pulse generator, according to some embodiments.

However, the path from front panel input 302 (of the input stage) shown in FIG. 3 may be modified as shown in FIG. 4. One important change in the circuits 400 and 450 shown in FIG. 4, is the addition of a pulse generator 414. In the exemplary circuits in FIG. 4, the pulse generator 414 is a digital pulse generator. However, various different embodiments may include a different type of pulse generator or any circuit which may be operated to deterministically produce the required pulses. The pulse 414 generator may be coupled to front panel input 402 (of the input stage) in a variety of ways, two examples of which are respectively shown in circuits 400 and 450. In circuit 400, a relay 416 switches the pulse generator 414 into the signal path. Similar to FIG. 3, a relay 404 may couple or connect the front panel input 402 to shunt 406. The pulse generator's signal path also includes a 50Ω shunt 412. Relay 410 may be used to switch between different attenuation paths from compensated attenuator 408.

In circuit 450, the pulse generator 414 is connected to the signal path via relay (or switch) 424 through a shunt resistor 426 and a resistor 422. However during a typical acquisition the pulse generator drives 414 a static low or reference potential value (e.g. 0V) and provides additional termination for the front panel input 402. The advantage of circuit 450 is that it requires one fewer large relay, and the pulse generator 414 remains coupled to the relay circuit. This is helpful in high frequency applications due to the parasitic s of the relay (or switch) 424. The exact choice of the main termination resistor (426) and the resistor (422) coupled directly to the pulse generator 414 may be modified from what is shown in circuits 400 and 450. However, they may be coupled such that the parallel combination of the two resistors (426 and 422) is nominally 50Ω (including the internal resistance of the digital buffer).

Figure 5:
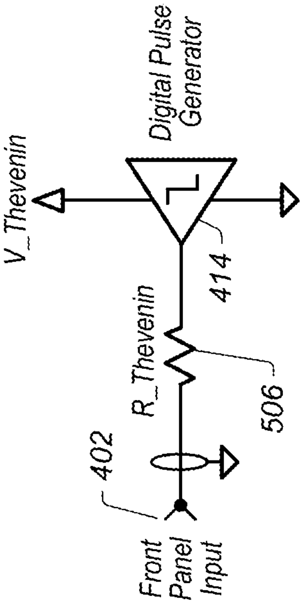
FIG. 5 shows a simplified circuit diagram of an exemplary Thevenin equivalent circuit for a pulse generator, according to some embodiments.
Figure 6:
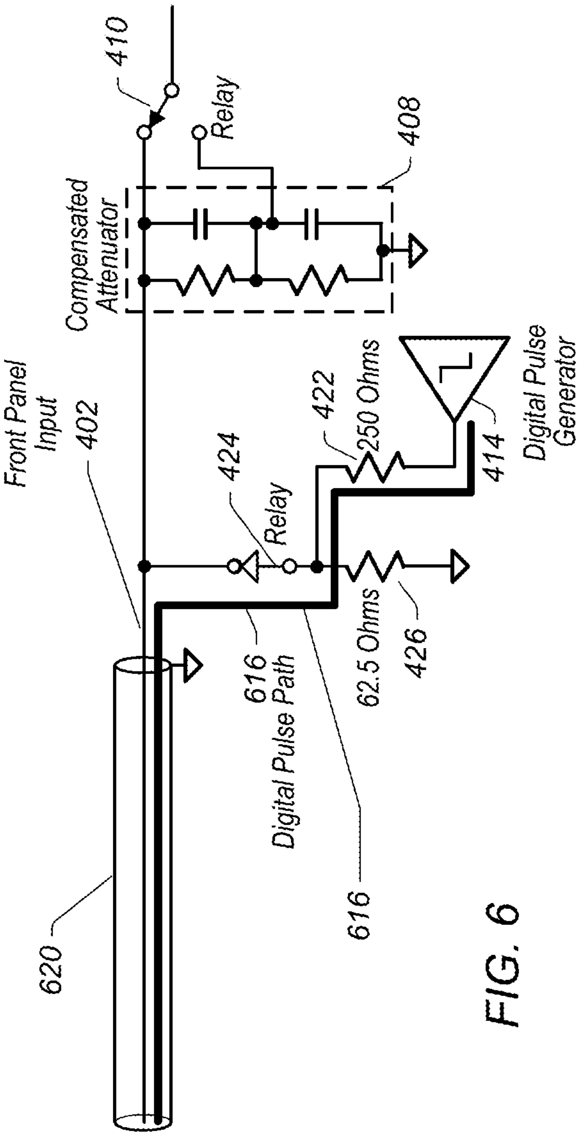
FIG. 6 shows a simplified circuit diagram illustrating a digital pulse generated on external cables and/or system, according to some embodiments.

Circuit 450 may be simplified using a Thevenin equivalent circuit as shown in FIG. 5. As shown in FIG. 5, R_Thevenin 506 is simply the parallel combination of the 62.5Ω resistor 426 and the 250Ω resistor 422 which equals 50Ω, and V_Thevenin becomes Vcc*62.5/(62.5+250). For example, in some embodiments that feature a common 2.5V digital logic, V_Thevenin would be 0.5V. During a system level health measurement, the pulse generator 414 may be toggled from a low value to a high value and transmit a pulse down the signal path 616 as illustrated in FIG. 6. As shown in FIG. 6, the cabling (or cable) connecting the measurement instrument (in this case the oscilloscope) to the device is illustrated by cable 620. The pulse generator 414, when at static low or high, may produce an AC input impedance of 50Ω, providing proper back termination. It should be noted that in some embodiments, instead of providing back termination the pulse generator may be switched out of the circuit or it may be set into a high impedance mode. From the voltage (Vm) acquired by the ADC, (e.g. ADC 318) each sample may be converted to an impedance through the following formula:

$$Z_o=[Vm/(V\_\text{Thevenin}-Vm)]*R\_\text{Thevenin}.$$

The reflection coefficient may be obtained by the following formula:

$$\rho=[(2*Vm)/Vin]-1.$$

Figure 7:
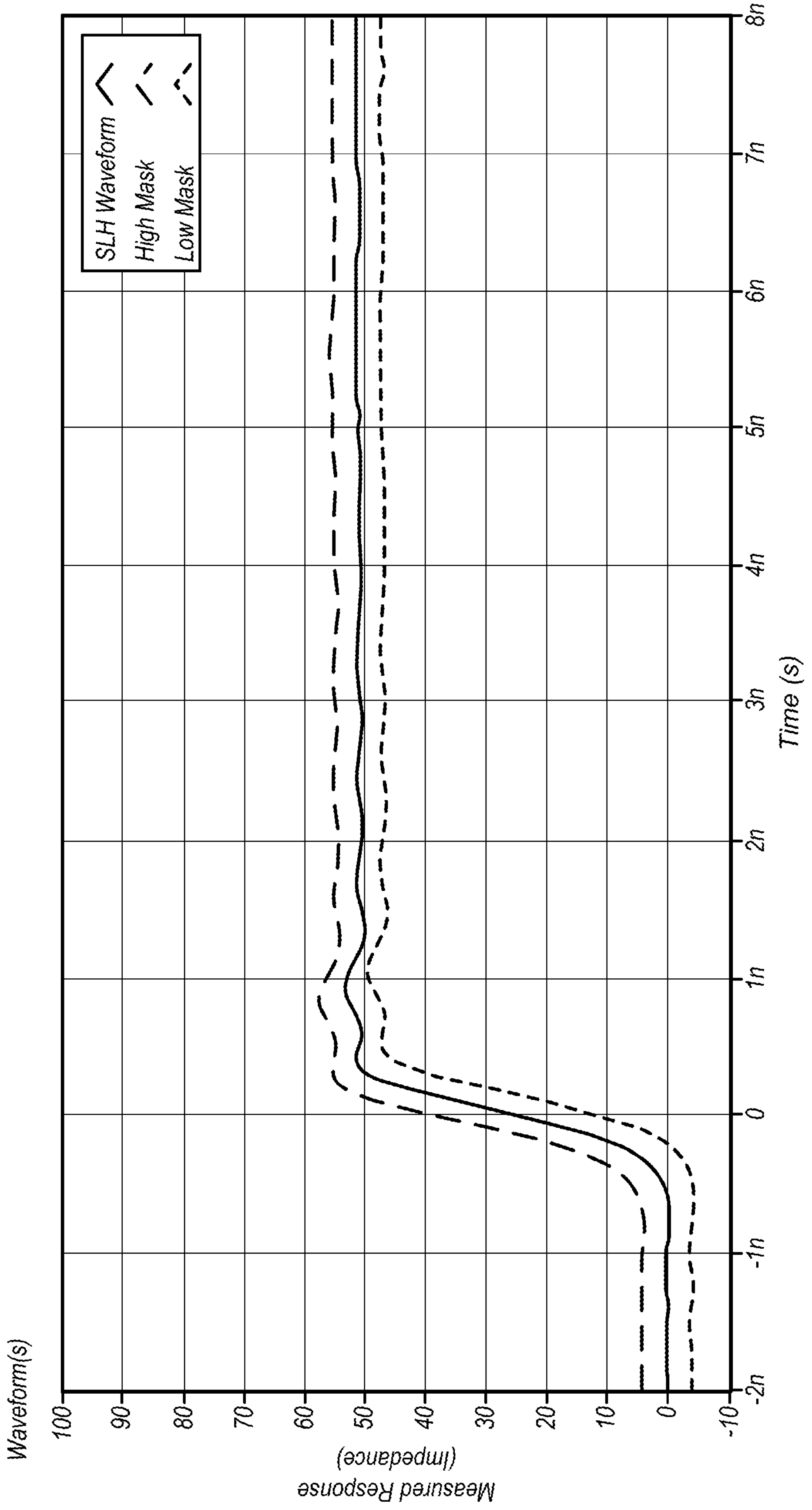
FIG. 7 shows a graph illustrating waveforms obtained during testing, used for obtaining a measured impedance response and determining system level health, according to some embodiments.

An example result from actual measurements is shown in FIG. 7. The graph shown in FIG. 7 includes three plots (curves or traces). The center trace (solid line) illustrates the acquired waveform. In this configuration, the trace is showing the impedance of the cable 620 attached to the oscilloscope's channel (i.e. the vertical axis is representative of the impedance of the cable attached to the oscilloscope's channel through an oscilloscope input connector/connection). Since typical oscilloscope coax cables have an impedance of 50 Ohms, impedance is what is being measured as illustrated in FIG. 7. In addition, a tool may be provided to automate the creation of masks which are illustrated as dashed lines (traces) above and below the trace representative of the acquired waveform. While the graph shown in FIG. 7 illustrates impedance vs. time, in some implementations and/or embodiments, the vertical axis may alternatively represent, reflection coefficient (ρ) or voltage while the horizontal axis may represent sample, time, or distance.

A mask may be created during automated test development and used when the test(s) are deployed. The purpose of the mask is to compare the measured response of the cables/relays to an expected response. If the measured response exceeds the previously defined mask, the system has changed, possibly due to a failing connector or relay, or perhaps an operator changed a cable without recalibrating the station.

Another advantage is that during mask creation users may identify which parts of their test system correspond to different points in time of the measurement. This may be helpful during production test to identify the location of the failure. For example, during an identified failure, the system level health test would identify which relay module, connector, or cable was responsible for the failure, which may allow for quick identification and replacement.

In various embodiments, at least the circuits 400 and/or 450, or any portion of circuits 400 and/or 450 shown in FIG. 4 may be implemented on an application specific integrated circuit (ASIC) that may be added to a wide variety of instruments and/or products to aid in performing the system-level health monitoring described above. In addition, such ASICs may be configured to monitor other cable/connection health attributes, such as leakage current, and may include additional functionality not tied to function generator 414. It should also be noted that in the embodiments described herein, system level health monitoring primarily refers to the monitoring of physical connectivity of instruments and devices under test, but other uses of the monitoring concepts described herein are possible and are contemplated.

More generally, pursuant to the above, a method for monitoring physical connectivity in a system may include generating, by a pulse generator in an instrument, a test signal down a signal path extending from the instrument to a device, acquiring, by data acquisition circuitry, a response signal generated in response to the test signal in the signal path and an additional signal path extending from a source of the test signal to the signal path, and obtaining, based at least on the response signal, a measured response representative of the signal path and the additional signal path. The method may further include comparing the measured response with an expected response, and determining a condition of the signal path and the additional signal path based on the results of the comparison. In some embodiments, the method may further include obtaining, based on the measured response, a parameter value associated with the signal path and the additional signal path, and obtaining, based on the expected response, a parameter value associated with the signal path and the additional signal path, and comparing the parameter value with the expected parameter value to determine the condition of the signal path and the additional signal path.

Further to the above, an instrument may include a test circuit to generate a test signal down a signal path that couples the instrument to a device. The instrument may further include a data acquisition circuit to acquire a response signal generated in response to the test signal in the signal path and an additional signal path extending from a source of the test signal to the signal path, obtain, based at least on the response signal, a measured response representative of the signal path and the additional signal path, compare the measured response with an expected response, and determine a condition of the signal path and the additional signal path based on results of the comparison. The data acquisition circuit may obtain, based on the measured response, a parameter value associated with the signal path and the additional signal path, it may further obtain, based on the expected response, an expected parameter value associated with the signal path and the additional signal path, and may compare the parameter value with the expected parameter value to determine the condition of the signal path and the additional signal path. In various embodiments, the parameter value may provide an indication of one of a measured impedance representative of the signal path, a measured return voltage representative of the signal path, or a measured reflection coefficient representative of the signal path, while the expected parameter value may provide an indication of one of an expected impedance representative of the signal path, an expected return voltage representative of the signal path, or an expected reflection coefficient representative of the signal path. In some embodiments, the test circuit may include a pulse generator toggling from a low state to a high state to generate the test signal, which may thereby result in a plurality of pulses. The data acquisition circuit may sample the response signal to obtain a plurality of sample values, and obtain the measured response from the plurality of sample values.

Further in accordance with the above, a test circuit for monitoring physical connectivity in a system may include a signal-generating circuit for generating a test signal, and a switching circuit for switchably coupling the signal-generating circuit into a signal path extending between an instrument and a device. The test circuit may also include a data acquisition circuit for acquiring a response signal generated in response to the test signal in the signal path and an additional signal path extending from a source of the test signal to the signal path. The data acquisition circuit may further obtain, based at least on the response signal, a measured response representative of the signal path and the additional signal path, compare the measured response with an expected response, and determine a condition of the signal path and the additional signal path based on results of the comparison.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A method for monitoring physical connectivity in a system, the method comprising:

generating, by a pulse generator in an instrument, a test signal down a signal path extending from the instrument to a device;

acquiring, by data acquisition circuitry, a response signal generated in response to the test signal in the signal path and an additional signal path extending from a source of the test signal to the signal path;

obtaining, based at least on the response signal, a measured response representative of the signal path and the additional signal path;

comparing the measured response with an expected response; and determining a condition of the signal path and the additional signal path based on said comparing.

2. The method of claim 1, further comprising:

obtaining, based on the measured response, a parameter value associated with the signal path and the additional signal path; and obtaining, based on the expected response, a parameter value associated with the signal path and the additional signal path;

wherein said comparing comprises comparing the parameter value with the expected parameter value.

3. The method of claim 1, wherein when in a static state, the pulse generator produces a specified alternating current (AC) impedance for a designated back termination at a connector of the instrument from where the signal path extends to the device.

4. The method of claim 1, wherein said generating the test signal comprises switchably coupling the pulse generator into the additional signal path.

5. The method of claim 1, wherein the data acquisition circuitry comprises an analog-to-digital converter, wherein said obtaining the measured response comprises digitizing the response signal.

6. The method of claim 1, wherein the signal path comprises cabling connected between the instrument and the device.

7. The method of claim 1, wherein the pulse generator is comprised in one of:

an input stage of the instrument, wherein the signal path extends from an input connection of the input stage to the device; or an output stage of the instrument, wherein the signal path extends from an output connection of the output stage to the device.

8. The method of claim 1, further comprising:

switchably coupling the pulse generator into the signal path prior to said generating the test signal.

9. An instrument comprising:

a test circuit configured to generate a test signal down a signal path that couples the instrument to a device; and a data acquisition circuit configured to:

acquire a response signal generated in response to the test signal in the signal path and an additional signal path extending from a source of the test signal to the signal path;

obtain, based at least on the response signal, a measured response representative of the signal path and the additional signal path;

compare the measured response with an expected response; and determine a condition of the signal path and the additional signal path based on results of the comparison.

10. The instrument of claim 9, wherein the data acquisition circuit is further configured to:

obtain, based on the measured response, a parameter value associated with the signal path and the additional signal path;

obtain, based on the expected response, an expected parameter value associated with the signal path and the additional signal path; and compare the parameter value with the expected parameter value to determine the condition of the signal path and the additional signal path.

11. The instrument of claim 9;

wherein the parameter value provides an indication of one of:

a measured impedance representative of the signal path;

a measured return voltage representative of the signal path; or a measured reflection coefficient representative of the signal path; and wherein the expected parameter value provides an indication of one of:

an expected impedance representative of the signal path;

an expected return voltage representative of the signal path; or an expected reflection coefficient representative of the signal path.

12. The instrument of claim 9, wherein the test circuit comprises a pulse generator configured to toggle from a low state to a high state to generate the test signal, wherein the test signal comprises a plurality of pulses.

13. The instrument of claim 12 further comprising:

a switching circuit configured to switchably couple the pulse generator into the signal path.

14. The instrument of claim 9, wherein the data acquisition circuit is further configured to:

sample the response signal to obtain a plurality of sample values; and obtain the measured response from the plurality of sample values.

15. A test circuit for monitoring physical connectivity in a system, the test circuit comprising:

a signal-generating circuit configured to generate a test signal;

a switching circuit configured to switchably couple the signal-generating circuit into a signal path extending between an instrument and a device; and a data acquisition circuit configured to:

acquire a response signal generated in response to the test signal in the signal path and an additional signal path extending from a source of the test signal to the signal path;

obtain, based at least on the response signal, a measured response representative of the signal path and the additional signal path;

compare the measured response with an expected response; and determine a condition of the signal path and the additional signal path based on results of the comparison.

16. The test circuit of claim 15, wherein the data acquisition circuit is further configured to:

obtain, based on the measured response, a parameter value associated with the signal path and the additional signal path;

obtain, based on the expected response, an expected parameter value associated with the signal path and the additional signal path; and compare the parameter value with the expected parameter value to determine the condition of the signal path and the additional signal path.

17. The test circuit of claim 15;

wherein the parameter value provides an indication of one of:

a measured impedance representative of the signal path;

a measured return voltage representative of the signal path; or a measured reflection coefficient representative of the signal path; and wherein the expected parameter value provides an indication of one of:

an expected impedance representative of the signal path;

an expected return voltage representative of the signal path; or an expected reflection coefficient representative of the signal path.

18. The test circuit of claim 17, wherein the signal path comprises cabling connected between the instrument and the device.

19. The test circuit of claim 15, wherein the signal-generating circuit comprises a pulse generator configured to toggle from a low state to a high state to generate the test signal, wherein the test signal comprises a plurality of pulses.

20. The test circuit of claim 15, wherein the data acquisition circuit is further configured to:

sample the response signal to obtain a plurality of sample values; and obtain the measured response from the plurality of sample values.

* * * * *